United States Patent
Ferrari et al.

(10) Patent No.: US 6,209,394 B1
(45) Date of Patent: Apr. 3, 2001

(54) INTEGRATED ANGULAR SPEED SENSOR DEVICE AND PRODUCTION METHOD THEREOF

(75) Inventors: Paolo Ferrari, Gallarate; Benedetto Vigna, Potenza; Aurea Cuccia, Milan; Marco Ferrera, Domodossola; Pietro Montanini, Melegnano, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/178,285

(22) Filed: Oct. 23, 1998

(30) Foreign Application Priority Data

Oct. 23, 1997 (EP) .................................. 97830537

(51) Int. Cl.$^7$ ....................................... G01P 9/04
(52) U.S. Cl. ..................................... 73/504.14; 73/504.12
(58) Field of Search ........................... 73/504.12, 504.14, 73/504.15, 504.04, 504.16, 1.37, 514.32

(56) References Cited

U.S. PATENT DOCUMENTS

| | | | | |
|---|---|---|---|---|
| 5,359,893 | * | 11/1994 | Dunn | 73/504.12 |
| 5,635,638 | * | 6/1997 | Geen | 73/504.12 |
| 5,728,936 | * | 3/1998 | Lutz | 73/504.12 |
| 5,894,091 | * | 4/1999 | Kubota | 73/504.12 |
| 5,895,852 | * | 4/1999 | Moriya et al. | 73/504.12 |
| 5,969,225 | * | 10/1999 | Kobayashi | 73/504.12 |

FOREIGN PATENT DOCUMENTS

| | | |
|---|---|---|
| 0 623 807 | 11/1994 | (EP) . |
| 0 778 458 | 6/1997 | (EP) . |
| 06123632 | 5/1994 | (JP) . |
| WO 96/35957 | 11/1996 | (WO) . |

OTHER PUBLICATIONS

Bernstein, J. et al., "A Micromachined Comb–Drive Tuning Form Rate Gyroscope", *IEEE Proceedings Micro Electro Mechanical System, Robotics and Automation Society*, Fort Lauderdale, Florida, Feb. 7–10, 1993, pp. 143–148.

Tanaka, K. et al., "A micromachined vibrating gyroscope", *Sensors and Actuators*, A 50, 1995, pp. 111–115.

Johnson, B, "Vibrating Rotation Sensors" (British Aerospace Systems & Equipment), *Society of Automotive Engineers Trans.*, vol. 104(6), Feb. 1995, pp. 41–47.

* cited by examiner

*Primary Examiner*—Helen C. Kwok
(74) *Attorney, Agent, or Firm*—Theodore E. Galanthay; Robert Iannucci; Seed IP Law Group PLLC (57) ABSTRACT

An angular speed sensor comprises a pair of mobile masses which are formed in an epitaxial layer and are anchored to one another and to the remainder of the device by anchorage elements. The mobile masses are symmetrical with one another, and have first mobile excitation electrodes which are intercalated with respective first fixed excitation electrodes and second mobile detection electrodes which are intercalated with second fixed detection electrodes. The first mobile and fixed excitation electrodes extend in a first direction and the second mobile and fixed detection electrodes extend in a second direction which is perpendicular to the first direction and is disposed on a single plane parallel to the surface of the device.

14 Claims, 5 Drawing Sheets

INTEGRATED ANGULAR SPEED SENSOR DEVICE AND PRODUCTION METHOD THEREOF

TECHNICAL FIELD

The present invention relates to an integrated angular speed sensor device and the production method thereof.

As is known, an angular speed sensor, or gyroscope, or yaw sensor, is a device which can measure the variation of direction of the speed vector of a moving body.

BACKGROUND OF THE INVENTION

Angular sensors can be used in the car industry, for ABS, active suspensions, ASR, dynamic control of the vehicle and ineitial navigation systems; in consumer goods, for image stabilization systems in cinecameras, in sports equipment, in three-dimensional "mice"; in industrial process control, for example in the control of industrial machines, in robotics; in the medical field; and in the military field, for new weapons systems.

Conventional gyroscopes, which are based on conservation of the angular moment of a rotating mass, are too costly and bulky, and are insufficiently reliable for the new applications. In addition, although optical fiber and laser gyroscopes have excellent performance levels, they are too costly for the applications indicated.

The increasing need for small, inexpensive gyroscopes has stimulated development activity in many industrial and academic research centers. In about the 1950s, the first vibrating gyroscopes were thus produced: they measure the angular speed of the systems on which they are fitted, by detecting the effect of the Coriolis force on a mass which vibrates in the non-inertial rotating system. In these sensors it is essential for the sensing mass to be kept moving by means of an actuation mechanism. The first gyroscope produced in the 1950s used a magnetic field for excitation of the sensing mass and detection of the Coriolis force; subsequently in the 1960s, the piezoelectric effect, which is now the most commonly used type, was employed (see for example B. Johnson, "Vibrating Rotation Sensors", Sensors and Actuators, 1995, SAE, SP-1066, pages 41–47).

At present, there is need for vibrating gyroscopes in which the motion-sensing device comprises a silicon microstructure. In fact, the possibility of using machinery and production processes which are typical of the microelectronics industry should make it possible to produce gyroscopes in large volumes and at a low cost, which are essential requirements for car industry and consumer goods applications.

SUMMARY OF THE INVENTION

In one aspect, the present invention provides a motion-sensing device that is a vibrating-type, integrated angular speed sensor and a production method that results in a motion-sensing device at a low cost, and with a high level of performance and reliability.

In one aspect, the integrated angular speed sensor device includes a mobile structure anchored to a semiconductor material body and having first mobile excitation electrodes which are intercalated with first fixed excitation electrodes. The first mobile and first fixed excitation electrodes have a first direction of extension. The speed sensor device also includes second mobile detection electrodes which are intercalated with second fixed detection electrodes. The second mobile and second fixed detection electrodes have a second direction of extension which is substantially perpendicular to said first direction.

In another aspect, the present invention includes a method for production of an integrated angular speed sensor device. The method includes forming a mobile structure having first mobile excitation electrodes which are intercalated with first fixed excitation electrodes and which extend in a first direction of extension and forming second mobile detection electrodes which are intercalated with second fixed detection electrodes which extend in a second direction of extension which is substantially perpendicular to said first direction.

BRIEF DESCRIPTION OF THE DRAWINGS

For the understanding of the present invention, a preferred embodiment is now described, purely by way of non-limiting example, with reference to the attached drawings, in which.

DETAILED DESCRIPTION OF THE INVENTION

In one embodiment, the present device includes a motion-sensing device 1 and related signal processing circuitry. The motion-sensing device 1, which is shown in detail in FIGS. 1–3, has a structure which is symmetrical with respect to a horizontal central axis indicated at A in FIG. 1, in which, consequently, only approximately half of the motion-sensing device 1 is shown. The motion-sensing device 1 comprises two mobile masses 2a and 2b, which are connected to one another and are anchored to a bulk region 12 of $N^+$-doped polycrystalline silicon by anchorage elements 3 and 4.

Figure 1:
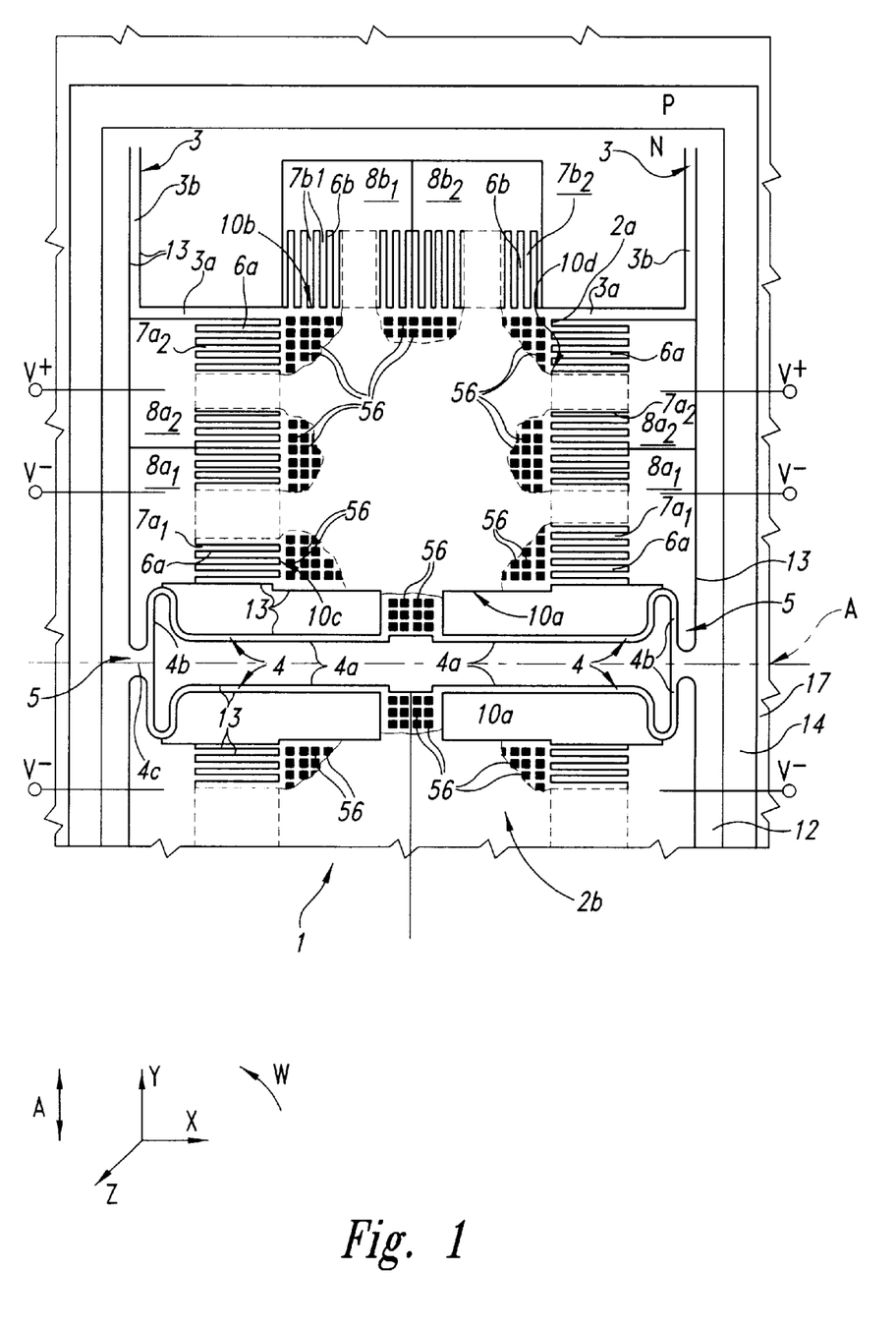
FIG. 1 is a simplified plan view of part of an integrated circuit incorporating a motion-sensing device, in accordance with embodiments of the present invention.

In detail, as viewed from above, the mobile masses 2a, 2b have substantially the shape of two adjacent squares or rectangles which have first sides 10a facing one another, second sides 10b are parallel to the first sides, and third and fourth sides 10c, 10d perpendicular to the first and second sides 10a, 10b. From the first sides 10a of the mobile masses 2a, 2b (which face one another) there extend the anchorage elements 4. From the second, third and fourth sides 10b–10d of each of the mobile masses 2a, 2b, there extend elongate extensions which form mobile electrodes 6a, 6b of the sensor, and specifically, the mobile electrodes 6a extend from the third and fourth sides 10c, 10d of each of the mobile masses 2a, 2b, perpendicularly to the sides 10c, 10d, and form mobile excitation electrodes, whereas the mobile electrodes 6b extend from the second side 10b of each mobile mass 2a, 2b, perpendicularly to the second side 10b, and form mobile detection electrodes.

The anchorage elements 3 extend from the corners of the mobile masses 2a, 2b between the third side 10c, the second side 10b and the fourth side 10d of the mobile masses 2a, 2b. The anchorage elements 3 are L-shaped and comprise, starting from the mobile mass 2a, 2b, a first section 3a which is parallel to the mobile electrodes 6a, and a second section 3b which is parallel to the mobile electrodes 6b. The second section 3b extends away from the mobile electrodes 6a. On the other hand, the anchorage elements 4 extend from the center of the first sides 10a of the mobile masses 2a, 2b. The anchorage elements 4, starting from the mobile masses 2a, 2b, comprise first sections 4a which are parallel to the mobile electrodes 6a; second sections 4b which are U-shaped, with concavities which face one another, and a third section 4c which is common to the two anchorage elements 4 which face one another, thereby forming two forks 5 which face one another and extend between the two mobile masses 2a, 2b.

The mobile electrodes 6a, 6b are intercalated or interdigitated (alternate) with fixed electrodes $7a_1$, $7a_2$ and $7b_1$, $7b_2$, starting from respective fixed regions $8a_1$, $8a_2$ and $8b_1$, $8b_2$. In particular, the fixed electrodes $7a_1$ and $7a_2$ are interdigitated with the mobile electrodes 6a and are adjacent to one another. For both the third and fourth sides 10c, 10d of the mobile masses 2a, 2b, the fixed electrodes $7a_1$ are disposed in the vicinity of the anchorage elements 4 and the fixed electrodes $7a_2$ are disposed in the vicinity of the anchorage elements 3. The fixed electrodes $7b_1$ and $7b_2$ are interdigitated with the mobile electrodes 6b and are adjacent to one another. The fixed electrodes $7b_1$ are disposed on the left in FIG. 1, and the fixed electrodes $7b_2$ arc disposed on the right. The fixed electrodes $7a_2$ are biased to a positive voltage with respect to the fixed electrodes $7a_1$, as symbolized in the Figure by the voltages $V^+$ and $V^-$. In one embodiment, the voltage $V^+$ applied to the fixed electrodes $7a_2$ is a square wave, and is in counter-phase or phase opposition for the two mobile masses 2a, 2b, such as to generate a direct force alternately towards the top and towards the bottom of FIG. 1. This imparts a vibratory movement in the direction of the axis Y to the mobile masses 2a, 2b. The fixed electrodes $7b_1$ and $7b_2$ represent the electrodes for detection of the signal generated by the mobile masses 2a, 2b, as described hereinafter.

Figure 2:
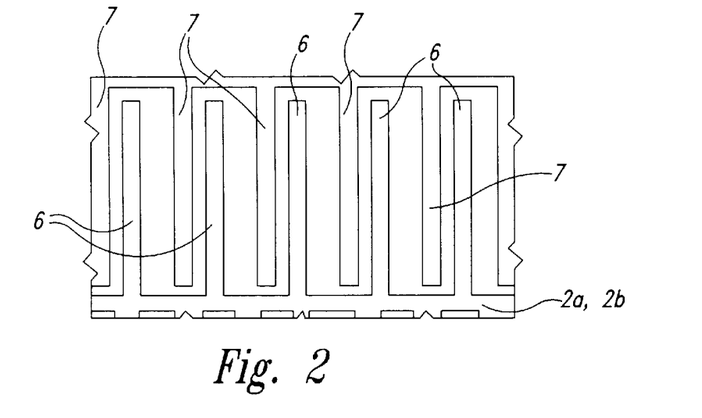
FIG. 2 is an enlarged view of a portion of the integrated circuit of FIG. 1, in accordance with embodiments of the present invention.

The distance between each mobile electrode 6a, 6b and the two facing fixed electrodes $7a_1$, $7a_2$, $7b_1$, $7b_2$ in the static condition (in the absence of vibrations) is not the same, as shown in the enlarged detail in FIG. 2 in which the mobile electrodes are simply indicated as 6 and the fixed electrodes as 7. Thereby, together with the two fixed electrodes 7 which faces it, each mobile electrode 6 forms two capacitors which are parallel with one another, one of which (the one which is defined by the mobile electrode 6 and by the fixed electrode 7 at a shorter distance) constitutes the capacitor which determines vibration of the two mobile masses 2a and 2b or generation of the signal that is detected and processed to determine the angular speed of the device.

In one embodiment of the motion-sensing device 1, the various regions which form the mobile masses 2a, 2b, the mobile electrodes 6a, 6b, the anchorage elements 3, 4, the fixed regions $8a_1$, $8a_2$, $8b_1$, $8b_2$ and the fixed electrodes $7a_1$, $7a_2$, and $7b_1$, $7b_2$ (which, in one embodiment, all comprise polycrystalline silicon of $N^+$-type) are separated from one another and from the bulk region 12 by a trench 13, the overall shape of which is shown in FIG. 1. In one embodiment, the bulk region 12 is surrounded by a first P-type polycrystalline epitaxial region 14, which in tutn is surrounded by a second P-type polycrystalline epitaxial region 17. The two polycrystalline epitaxial regions 14, 17 are separated from one another by a second trench 15 with a closed rectangular shape, which electrically insulates the motion-sensing device 1 from the remainder of the device.

Figure 3:
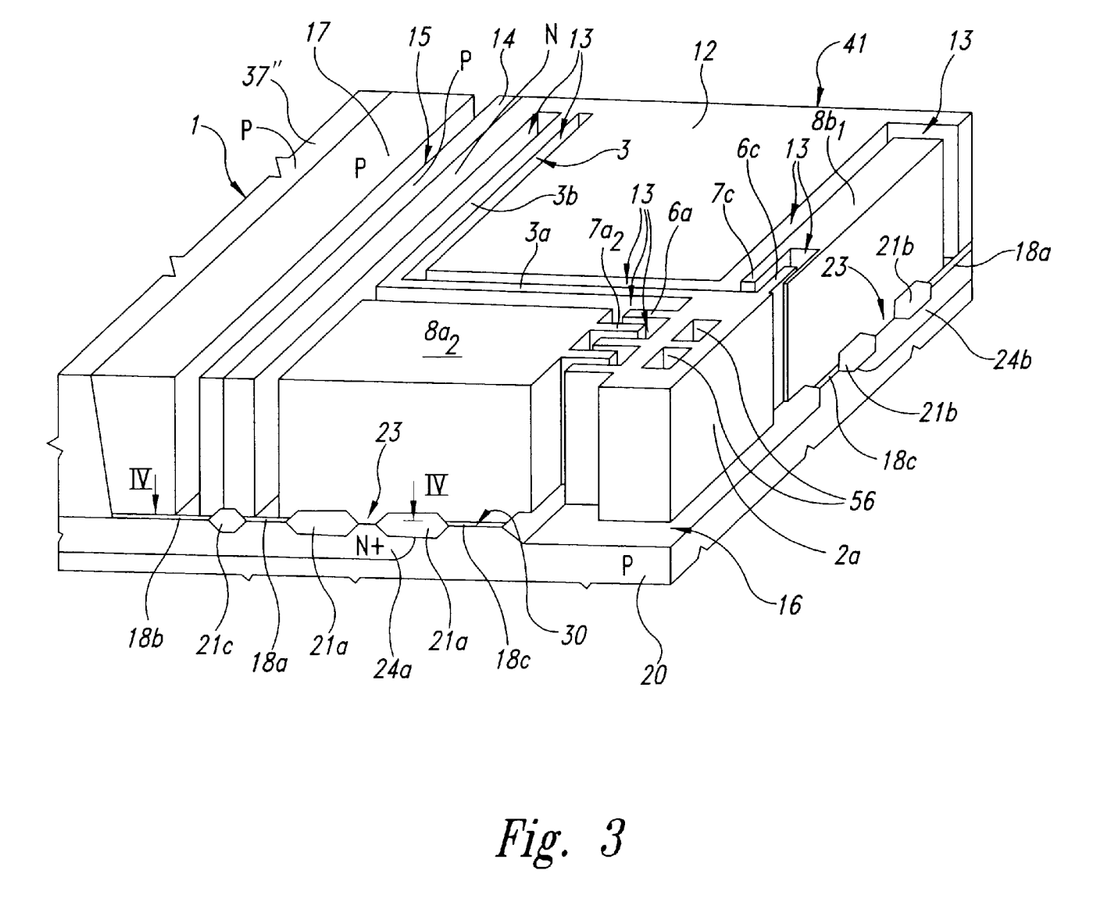
FIG. 3 is a simplified isometric cross-section of a portion of the motion-sensing device of FIG. 1, in accordance with embodiments of the present invention.
Figure 4:
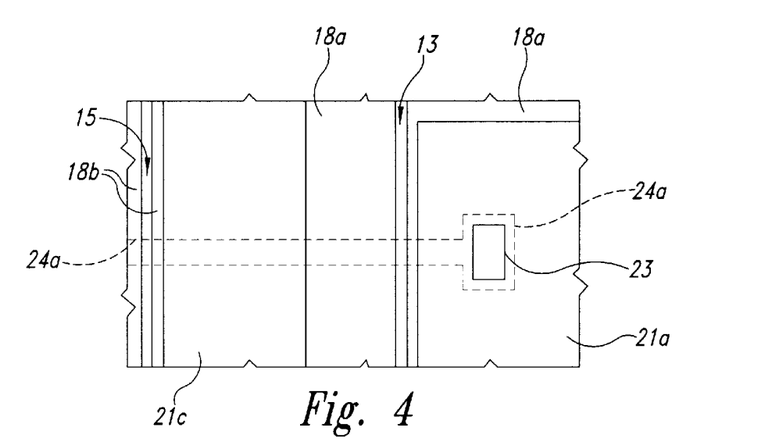
FIG. 4 is a simplified cross-sectional view of the motion-sensing device, taken along the plane IV—IV of FIG. 3, in accordance with embodiments of the present invention.
Figure 10:
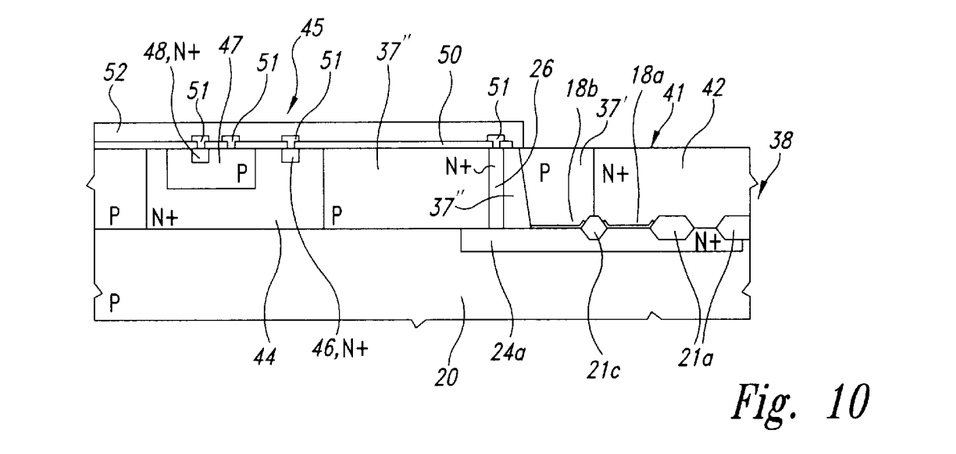
Figure 11:
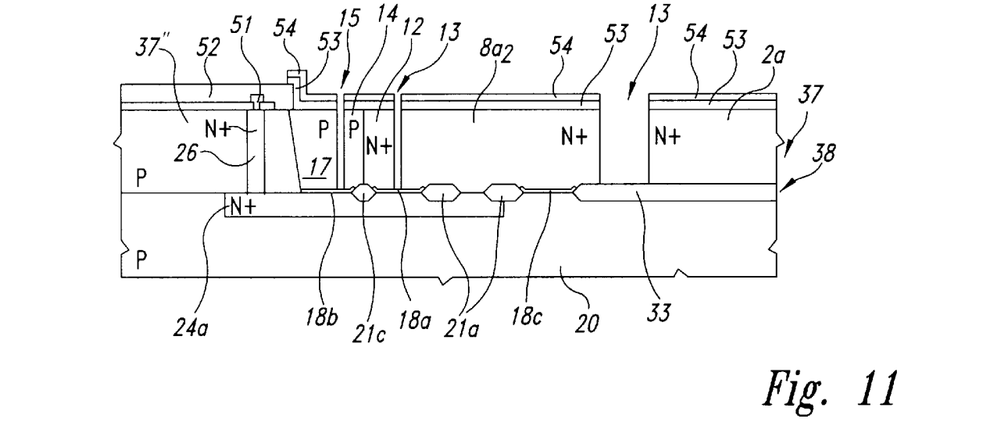
Figure 12:
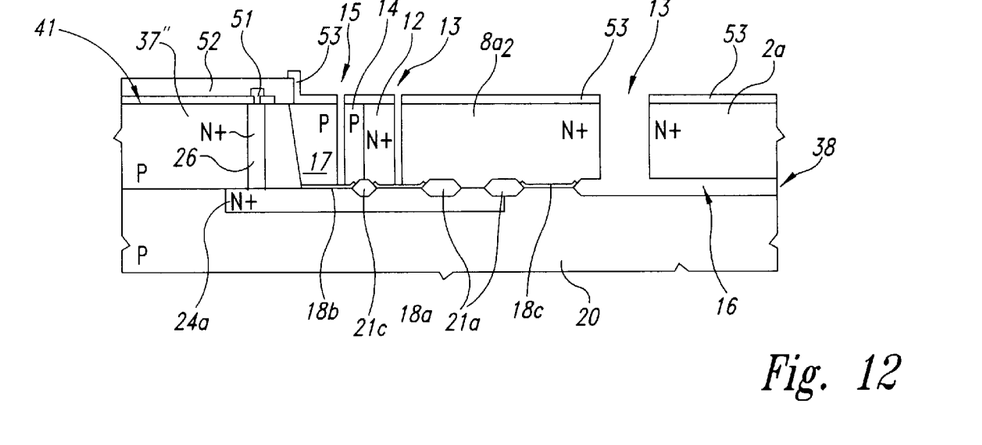
Figure 13:
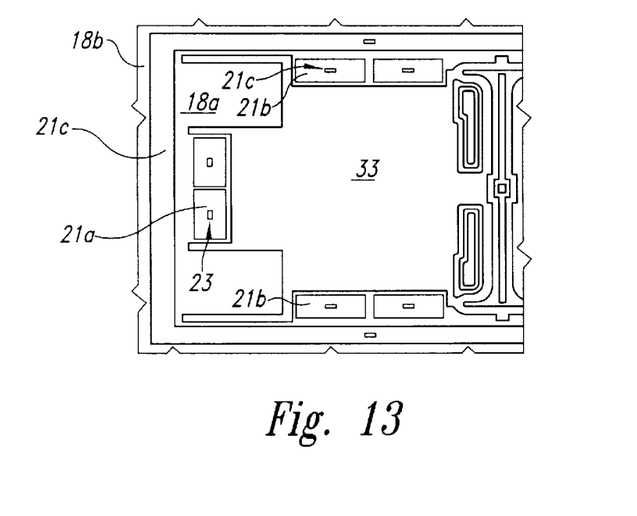
FIG. 13 is a simplified plan view of the motion-sensing device, showing the shape of buried regions which are formed in an intermediate step of the present method, in accordance with embodiments of the present invention.

The fixed regions $8a_1$, $8a_2$, $8b_1$, $8b_2$ and the bulk region 12 are biased by buried contacts, as shown in FIG. 3 for the regions $8a_2$ and $8b_1$. In one embodiment, the regions $8a_2$ and $8b_1$ extend above a P-type substrate 20, and are electrically insulated therefrom by a nitride region 18c, a nitride region 18a, and thick oxide regions 21a, 21b, as shown in FIG. 13. In one embodiment, shown in FIG. 3, the thick oxide regions 21a, 21b have in their center an aperture 23, at which the fixed regions $8a_2$ and $8b_1$ are in electrical contact with respective $N^+$ buried contact regions 24a, 24b extending along the upper surface 30 of the substrate 20. In one embodiment, the buried contact regions 24a, 24b extend from the apertures 23, below a series of insulating regions which include the nitride region 18a, a thick oxide region 21c and a nitride region 18b, as shown near the sensor area for the buried contact region 24a, which is also shown in FIG. 4. The buried contact regions 24a, 24b extend beyond the confines of the polycrystalline epitaxial region 17, below a monocrystalline epitaxial region 37", where the buried contact regions are in electrical contact with corresponding deep contact or sinker regions, as shown in FIGS. 10–12 for the buried contact region 24a, which is electrically connected to the sinker region 26, extending from a surface 41 of the wafer. As shown, contact with the other fixed regions $8a_1$, $8a_2$, $8b_2$ and with the bulk region 12 (which is electrically coupled to the mobile masses 2a, 2b) is obtained in a manner similar to that described for the fixed region $8a_2$, and in particular the bulk region 12 is connected by a buried contact region (not shown) extending parallel to the region 24a, along a plane parallel to that of the cross-sectional view shown in FIG. 3.

As can be seen in FIG. 3, the trench 13 extends from the surface 41 of the device as far as an air gap 16 in the area of the mobile masses 2a, 2b of the mobile electrodes 6a, 6b, of the fixed electrodes $7a_1$, $7a_2$, and $7b_1$, $7b_2$ and of the anchorage elements 3, 4, and as far as the insulating nitride regions 18a in the area of the fixed regions $8a_1$, $8a_2$ and $8b_1$, $8b_2$. The trench 15 extends from the surface 41 of the device as far as the insulating nitride region 18b.

In the above-described embodiment of the motion-sensing device 1, the presence of the two mobile masses 2a, 2b and of the anchorage forks 5 makes it possible to eliminate, by suitable signal processing, effects caused by apparent inertial forces to which the two mobile masses are subjected. In fact, if the non-inertial system does not rotate, but is subject to linear acceleration A, the two mobile masses 2a, 2b (which have the same mass m) are subjected to a force $F_a$ which is the same for both. On the other hand, the Coriolis force $F_c$ is dependent on the direction of the speed vector, and by subtracting the signals detected by the fixed electrodes $7b_1$, $7b_2$, it is possible to eliminate the common effect caused by the inertial force $F_a$. If W is the angular speed of the non-inertial system, and A is its linear acceleration, the Coriolis force $F_c$ which acts on the mobile mass with a mass in moving with a speed V relative to the rotating system, is provided by the vector product:

$$F_c=2m(W\times V),$$

whereas the inertial force $F_a$ caused by the effect of the acceleration A is:

$$F_a=mA.$$

Since the two mobile masses 2a, 2b move in phase opposition, an overall force $F_a+F_c$ acts on one of the two mobile masses, and an overall force $F_a$–$F_c$ acts on the other. If the two signals resulting from these two forces are then subtracted, a measurement is obtained of the effect induced by the Coriolis force $F_c$.

In the structure shown, both excitation and detection are electrostatic. The pairs of electrodes 6a, $7a_1$, $7a_2$ make the mobile masses 2a, 2b oscillate along the axis Y at their resonance frequency, thus optimizing the conversion of the electrical energy into mechanical energy. In contrast, the pairs of electrodes 6b, $7b_1$, $7b_2$, owing to the effect of the vibration (aforementioned force $F_a$) and of the rotation (Coriolis force $F_c$), which give rise to variation of the distance of the electrodes in the direction X, detect a variation of the capacitance associated with the pairs of electrodes 6b, $7b_1$, $7b_2$, and generate a corresponding signal which can be processed by the associated circuitry.

In some embodiments, the motion-sensing device 1 is manufactured in the manner described hereinafter with reference to FIGS. 5–13, in which the thicknesses of the various layers of material are not shown to scale, and some layers are not shown in all Figures, for clarity of representation and ease of understanding.

Figure 5:
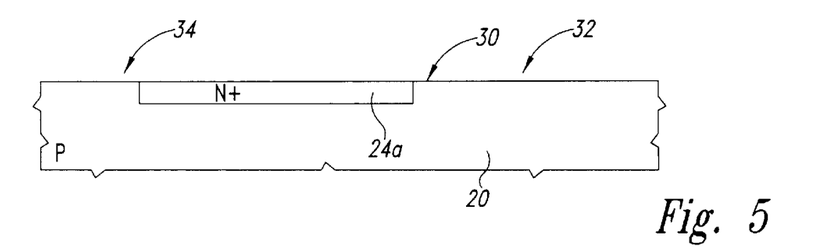
FIGS. 5–12 are simplified cross-sectional views through a wafer of semiconductor material incorporating the motion-sensing device, in accordance with embodiments of the present invention.
Figure 6:
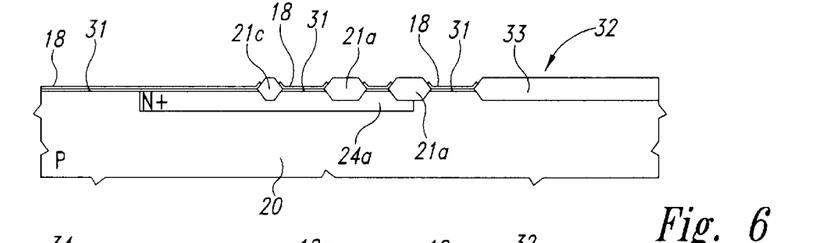
Figure 7:
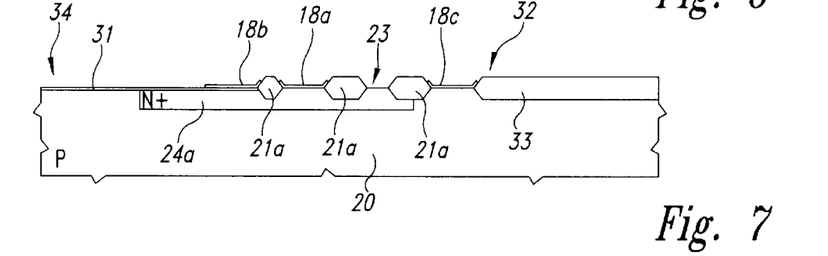

As shown in the embodiment of FIG. 5, a sensor area 32 and a circuitry area 34 are defined in the P-type monocrystalline silicon substrate 20 by conventional photomasking and ion implantation techniques. The $N^+$ buried contact regions are similarly formed (only the buried contact region 24a is shown in FIG. 5). A pad oxide layer 31 is formed, for example thermally grown, on the surface 30 of the substrate 20 with a thickness of 200–900 Å. A silicon nitride layer 18 is deposited, with a thickness of 700–3000 Å, above the pad oxide layer 31. The silicon nitride layer 18 is then photolithographically defined to have the shape shown in FIG. 13. The portions of the surface 30 of the substrate 20 which are not covered by the nitride layer 18 are then locally oxidized, with formation of thick oxide regions which comprise a sacrificial region 33 and the buried oxide regions 21a, 21b and 21c (only the regions 33, 21a and 21c are shown in FIG. 6), as well as similar regions for buried contact with the other electrodes. Reference is also made to FIG. 13, showing the various nitride and oxide regions which are present in this step.

Subsequently, after a photolithography step, plasma etching removes the portions of the layers 31, 18 in the sensor area 32 where the buried contacts of the motion-sensing device 1 are to be formed (apertures 23), and removes the silicon nitride layer 18 in the circuitry area 34. This provides the structure of FIG. 7, wherein the nitride regions 18a, 18b and 18c can be seen, but the underlying pad oxide regions are not shown.

Figure 8:
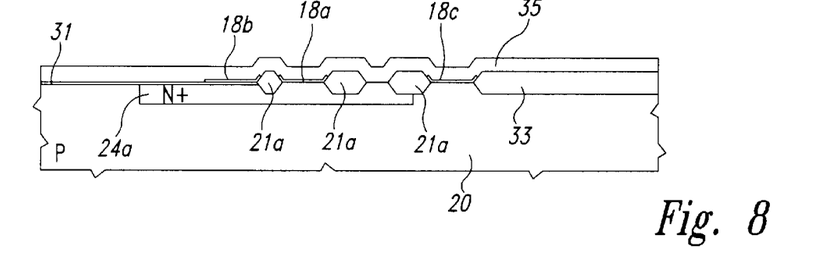
Figure 9:
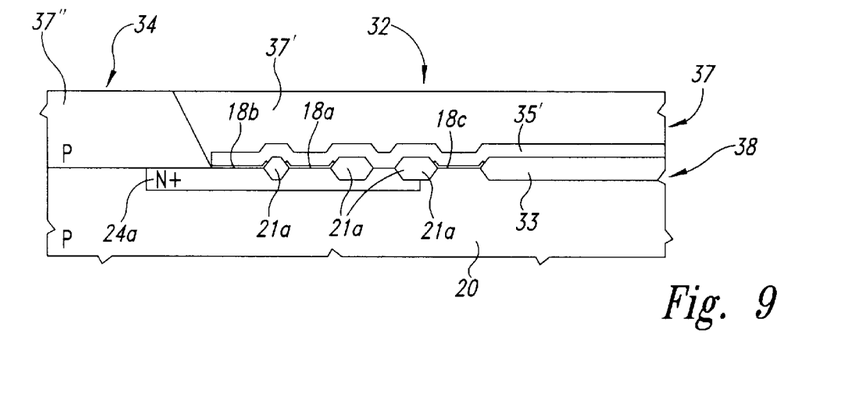

A polycrystalline or amorphous silicon layer 35 is then deposited as shown in FIG. 8. By a photolithography and plasma etching step, the polycrystalline or amorphous silicon layer 35 is removed, with the exception of the sensor area 32, forming a silicon region 35' which represents the nucleus for a subsequent epitaxial growth step. Then, by an etching step, the pad oxide layer 31 is removed where it is exposed, and epitaxial growth is carried out, with formation of a so-called pseudo-epitaxial P-type layer 37. The pseudo-epitaxial P-type layer 37 has a polycrystalline structure in the sensor area 32 (polycrystalline region 37'), and has a monocrystalline structure elsewhere (monociystalline region 37"). Thereby a wafer 38 is obtained, which is shown in FIG. 9.

Subsequently, the pseudo-epitaxial layer 37 is doped N-type by conventional ion implantation in order to produce sinker regions. In one embodiment, as shown in FIG. 10, a portion of the wafer 38 is shown which is slightly displaced to the left compared with FIGS. 5–9. The sinker region 26 is formed in the monocrystalline region 37", and a $N^+$ well region 42 is formed in the polycrystalline region 37', to accommodate the motion-sensing device 1, and to form the mobile masses 2a, 2b, the mobile and fixed electrodes 6, 7, and the bulk region 12. In particular, the well region 42 electrically contacts the buried contact region 24a in the position of the aperture 23 in the buried oxide region 21a.

Subsequently, the electronic elements of the circuitry are formed in the circuitry area 34 by conventional processing steps. In the example shown, an N-type collector well 44 is formed extending from the surface 41 of the wafer 38 to the substrate 20. An NPN transistor 45 is formed in the collector well 44, having a $N^+$ collector contact region 46, a P base region 47, and a $N^+$ emitter region 48.

On the surface 41 of the wafer 38, a dielectric layer 50 is then deposited for contact opening, for example of BPSG (Boron Phosphorous Silicon Glass). Then, by a masking and selective removal step, the contacts are opened in the circuitry area 34 and on the sinker region 26, the dielectric layer 50 is removed from the sensor area 32, and a metal layer is deposited and shaped, forming contacts 51 for the transistor 45 and for the motion-sensing device 1.

A passivation dielectric layer 52 is then deposited. The passivation dielectric layer 52 is removed in the area of the contact pads in order to permit electrical contacts to be made to the device, and in the sensor area 32, resulting in the structure of FIG. 10.

Then, a layer of silicon carbide 53 and an oxide layer 54 are then deposited and defined, to form a mask for the subsequent step of excavating the polycrystalline region 37'. In one embodiment, the oxide layer 54 is formed by conventional TEOS. In one embodiment, the oxide layer 53 forms the masking layer for subsequent etching of the trenches, whereas the carbide layer 54 forms the masking layer during the step of removing the sacrificial regions. Then, etching separates the fixed electrodes and the mobile electrodes, for separation of the fixed regions $8a_1$, $8a_2$ and $8b_1$, $8b_2$ from one another and from the remainder of the well 42, in order to form the anchorage elements 3, 4 for forming holes 56 (see FIGS. 1 and 3) inside the mobile masses 2a and 2b, and for insulation of regions which have different potential. In this step, the nitride regions 18a, 18b protect the substrate 20 and the buried contact region 24a against etching.

Thereby, the holes 56 and the trenches 13 and 15 are formed, and the P-type polycrystalline epitaxial region 37' is divided into the regions 14 and 17. Therefore, the structure is obtained which is shown in cross-section in FIG. 11, taken along the same cross-sectional plane as in FIG. 3.

Finally, the sacrificial region 33 is removed by wet etching with hydrofluoric acid or with hydrofluoric acid vapors, through the trenches 13 and 15 and the holes 56, and the area which was previously occupied by the sacrificial region 33 forms the air gap 16 which separates the mobile masses 2a, 2b, the corresponding anchorage elements 3 and 4, and the fixed electrodes 7, from the underlying substrate 20. In this step, the oxide layer 54 is also removed, whereas the silicon carbide layer 53 protects the polycrystalline silicon regions beneath, as well as the passivation dielectric layer 52. Thereby, the structure of FIG. 12 is obtained. By subsequent plasma etching, the silicon carbide layer 53 is removed from the entire wafer 38, thus providing the structure shown in FIGS. 1–4, which has previously been described.

Some advantages of the described device and production method are as follows. The structure of the above-described sensor element, with detection electrodes extending perpendicularly to the excitation electrodes, make it possible to directly detect the signal generated by virtue of speed variations of the device. Additionally, it is compatible with the process steps for production of integrated circuits, permitting integration of the motion-sensing device 1 and of the circuitry which processes the signal generated by the latter on a single integrated circuit. In this respect, it is particularly advantageous that an electrostatic solution is used both for excitation of the motion-sensing device 1, and for detection of the response. In the structure described, the connection of the two mobile masses 2a, 2b by means of two forks 5 ensures matching of the respective resonance frequencies. In turn, this permits elimination in a simple manner of the inertial acceleration effect.

Production of the two mobile masses 2a and 2b by means of epitaxial processing makes it possible to obtain better sensitivity than in structures in which the mobile mass is produced from a polyclystalline silicon layer deposited on the wafer, owing to the greater mass which can be obtained, and to the greater surface area of the actuation and detection capacitors (associated with the depth of the pseudo-epitaxial layer). The use of process steps which are typical of the microelectronics industry makes it possible to produce the sensor at a low cost, and to guarantee a high level of reliability.

Finally, it will be appreciated that many modifications and variants can be made to the device and the method described here, all of which are within the context of the inventive concept, as defined in the attached claims. In particular, the types of doping of the various regions can be inverted with one another; the circuitry can comprise both bipolar and MOS devices, and the details can be replaced by others which are technically equivalent.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An integrated angular speed sensor device, comprising a mobile structure anchored to a semiconductor material body and having first mobile excitation electrodes which are intercalated with first fixed excitation electrodes, said first mobile and first fixed excitation electrodes having a first direction of extension, and second mobile detection electrodes which are intercalated with second fixed detection electrodes, said second mobile and second fixed detection electrodes having a second direction of extension which is substantially perpendicular to said first direction, wherein said mobile structure comprises a first and a second mobile mass of quadrangular shape, said first and second mobile masses being separated from one another by an anchorage region, each of the first and second mobile masses having a first side which faces said anchorage region, a second side which is parallel to said first side, and a third and a fourth side which are parallel to one another and perpendicular to said first and second sides; the speed sensor device further comprising fixed first and second anchor sections positioned on opposite sides of the mobile structure; and first and second spring elements attached to and extending between the anchor sections in the anchorage region, the first spring element being attached to the first side of the first mobile mass and the second spring element being attached to the first side of the second mobile mass.

2. A device according to claim 1 wherein said semiconductor material body has a surface in a plane, and wherein said first and said second directions are in the plane of the surface.

3. A device according to claim 1 wherein said first and second spring elements are parallel to and spaced apart from one another in the anchorage region.

4. A device according to claim 3 wherein each said spring element comprises a pair of first anchorage sections extending from a center portion of said first side of a respective one of said mobile masses and a pair of U-shaped second anchorage sections respectively connecting one of said first anchorage sections to a respective one of the first and second anchor sections.

5. A device according to claim 1, further comprising L-shaped anchorage elements extending from opposite corners of each mobile mass, each anchorage element having a first section extending parallel to said first direction and a second section extending parallel to said second direction.

6. A device according to claim 1 wherein said mobile excitation electrodes extend from said third and fourth sides of said mobile masses, and wherein said mobile detection electrodes extend from said second side of said mobile masses.

7. A device according to claim 6 wherein said fixed excitation electrodes comprise first fixed electrodes and second fixed electrodes arranged adjacent to one another and facing both said third and fourth sides of said mobile masses, said first fixed electrodes being biased to different voltages from said second fixed electrodes, said fixed excitation electrodes of said first mobile mass being biased with a voltage which alternates in counter-phase to said fixed excitation electrodes of said second mobile mass.

8. A device according to claim 7 wherein said first and second fixed electrodes and said fixed detection electrodes extend from respective fixed support regions, and are electrically separated from one another and from said mobile masses by a shaped trench, and wherein said fixed support regions are connected to respective buried contact regions which extend in a substrate region of said semiconductor material body.

9. A device according to any one of the preceding claims wherein said semiconductor material body comprises a monocrystalline substrate and a pseudo-epitaxial layer extending on said substrate and including a polycrystalline epitaxial region and a monocrystalline epitaxial region adjacent to one another, said mobile structure and said fixed excitation and detection electrodes being formed in said polycrystalline epitaxial region, and wherein the device includes signal processing electronic elements formed in said monocrystalline epitaxial region.

10. An integrated angular speed sensor device, comprising:
   a semiconductor body having a surface in a plane;
   a mobile structure anchored to the semiconductor body;
   mobile excitation electrodes coupled to the mobile structure and to the semiconductor body;
   fixed excitation electrodes alternating with said mobile excitation electrodes, said mobile and fixed excitation electrodes having a first direction of extension;
   mobile detection electrodes coupled to the mobile structure and to the semiconductor body; and
   fixed detection electrodes alternating with said mobile detection electrodes, said mobile and fixed detection electrodes having a second direction of extension at an angle to said first direction, the mobile and fixed excitation and detection electrodes all being in the plane of the surface; wherein the semiconductor body includes a buried contact region that is doped to provide a conductive path, the buried contact region being electrically connected to the fixed electrodes.

11. The device of claim 10 wherein said mobile structure comprises:
- a first mobile mass;
- a second mobile mass, said first and second mobile masses formed adjacent to and spaced apart from one another; and
- an anchorage region formed therebetween, each of the first and second mobile masses having a first side facing said anchorage region, said first and second mobile masses being each anchored to a bulk region of said semiconductor body through first and second anchorage elements extending on opposite sides of each of said first and second mobile masses.

12. The device of claim 11 wherein said first anchorage elements extend in said anchorage region and form a pair of fork elements, each fork element including:
- a pair of first anchorage sections extending from a center portion of said first sides of said first and second mobile masses; and
- a pair of U-shaped second anchorage sections having reciprocally facing concavities and a common section.

13. The device of claim 10 wherein said second anchorage elements extend from opposed points on each said mobile mass and are L-shaped, with a first section extending parallel to said first direction and a second section extending parallel to said second direction.

14. The device of claim 10 wherein said semiconductor body comprises a monocrystalline substrate and a pseudo-epitaxial layer extending on said substrate and including a polycrystalline epitaxial region and a monocrystalline epitaxial region adjacent to one another, said mobile structure and said fixed excitation and detection electrodes being formed in said polycrystalline epitaxial region, and wherein the device includes signal processing electronic elements formed in said monocrystalline epitaxial region.

* * * * *

UNITED STATES PATENT AND TRADEMARK OFFICE
CERTIFICATE OF CORRECTION

PATENT NO. : 6,209,394 B1  Page 1 of 1
DATED : April 3, 2001
INVENTOR(S) : Paolo Ferrari et al.

It is certified that error appears in the above-identified patent and that said Letters Patent is hereby corrected as shown below:

Title page,
Item [30], the Foreign Priority Application number should read -- 97830537.3 --.

Column 10, claim 13,
Line 3, "The device of claim 10" should read -- The device of claim 12 --.

Signed and Sealed this

Second Day of April, 2002

*Attest:*

JAMES E. ROGAN
*Attesting Officer*  *Director of the United States Patent and Trademark Office*